United States Patent
Miller

(10) Patent No.: US 9,559,694 B2
(45) Date of Patent: Jan. 31, 2017

(54) STABLE SUPPLY-SIDE REFERENCE OVER EXTENDED VOLTAGE RANGE WITH HOT-PLUGGING COMPATIBILITY

(71) Applicant: Lattice Semiconductor Corporation, Hillsboro, OR (US)

(72) Inventor: Edward E. Miller, Beaverton, OR (US)

(73) Assignee: LATTICE SEMICONDUCTOR CORPORATION, Portland, OR (US)

(*) Notice: Subject to any disclaimer, the term of this patent is extended or adjusted under 35 U.S.C. 154(b) by 664 days.

(21) Appl. No.: 13/947,553

(22) Filed: Jul. 22, 2013

(65) Prior Publication Data

US 2015/0022233 A1   Jan. 22, 2015

(51) Int. Cl.
  *H03K 19/003*   (2006.01)
  *H03K 19/0185*   (2006.01)

(52) U.S. Cl.
  CPC .... *H03K 19/00315* (2013.01); *H03K 19/018528* (2013.01); *H03K 2217/0027* (2013.01)

(58) Field of Classification Search
  CPC ............ H03K 3/356121; H03K 3/35613; H03K 7/08; H03K 19/018528; H03K 17/0822; H03K 17/00; H03K 17/08142; H03K 17/102; H03K 17/122; H03K 19/00315; H03K 2217/0027; G05F 1/575; G05F 1/573; G05F 3/02; G05F 3/08; G05F 3/24; G05F 3/247; G05F 3/30; H02H 9/001; H02H 9/004; H02H 9/025; G01R 31/3004; G11C 5/147

USPC .... 326/68, 62, 63, 80–83, 86–87, 112, 115, 326/126, 127, 93, 9, 113; 327/108–109, 327/333, 540, 530, 538, 543
See application file for complete search history.

(56) References Cited

U.S. PATENT DOCUMENTS

| | | | |
|---|---|---|---|
| 5,592,423 A | 1/1997 | Tokami | |
| 6,304,462 B1* | 10/2001 | Balakrishnan et al. | ... 363/21.01 |
| 6,917,503 B2 | 7/2005 | Dai et al. | |
| 7,034,569 B1* | 4/2006 | Balasubramanian et al. | .. 326/38 |
| 7,813,094 B1 | 10/2010 | Sherwin | |
| 8,284,534 B2 | 10/2012 | Guillot et al. | |
| 2004/0012409 A1* | 1/2004 | Erhart | ............................ 326/81 |
| 2009/0009096 A1* | 1/2009 | Mojarradi et al. | ............ 315/194 |
| 2010/0188789 A1* | 7/2010 | Satake et al. | ................... 361/90 |
| 2010/0231193 A1* | 9/2010 | Nascimento et al. | ........ 323/315 |

* cited by examiner

Primary Examiner — Alexander H Taningco
Assistant Examiner — Seokjin Kim

(57) ABSTRACT

In one embodiment, the operating range of an over-current detection circuit is extended to higher input voltage levels by providing a reference-voltage generation circuit for the detection circuit with voltage protection circuitry that applies an additional voltage drop to shield other vulnerable transistor devices from the higher input voltages. In addition, bypass circuitry is provided that is inactive at the highest input voltage levels, but actively bypasses at least some of the voltage protection circuitry at relatively low input voltage levels to apply a voltage drop that is sufficient to ensure proper operation of the vulnerable transistor devices at the low voltage levels. In one implementation, the vulnerable transistor devices are NFET devices in a programmable current mirror of the reference-voltage generation circuit. In addition, a stiffened voltage divider helps to ensure sufficient voltage drop at the low voltage levels. The protection and bypass circuitry also enable hot-socketing operations.

17 Claims, 7 Drawing Sheets

STABLE SUPPLY-SIDE REFERENCE OVER EXTENDED VOLTAGE RANGE WITH HOT-PLUGGING COMPATIBILITY

TECHNICAL FIELD

The present invention relates to integrated circuits, such as field-programmable gate arrays (FPGAs), and, in particular, to reference-voltage generation circuitry for such integrated circuits.

BACKGROUND

One problem addressed by this disclosure is to provide detection circuitry that (i) senses high-voltage power-supply-referenced signals over a wide range of power-supply voltages, specifically voltages above the detection circuit's VDD-based voltage domain including voltages above which known circuit techniques are effective and (ii) also has hot-plug (hot-swap) compatibility. Operation over a wide range of power-supply voltages means that proper operation at many different supply voltages is supported. For example, in certain embodiments, the detection circuit should operate for a supply voltage of 12V (+/−10%) and any other system supply voltage down to 5V (+/−10%) or less. In order to monitor voltages during power supply ramp up, the detection circuit should operate at the lowest voltage achievable. Other techniques that are not part of this disclosure can be used for voltages below which the embodiments of this disclosure are operable.

Techniques for establishing accurate reference voltages, regardless of the exact application, are well known to those skilled in the art of integrated circuit design. The accuracy of the reference voltage should be maintained over all operating conditions, including the VDD supply voltage of the detection circuit.

FIG. 1 shows a schematic block diagram of a prior-art over-current detection circuit 100 which senses current flow (I2) from a supply voltage VIN through a power PFET (p-type field-effect transistor) switch 150 to drive load circuitry (not shown) at the load side of the switch at voltage VOUT. Supply voltage VIN and the load circuitry at node VOUT are often at voltages significantly higher than the supply voltage VDD for the detection circuit. Resistor Rtrip (internal to the detection circuit) and resistor Rsense (external to the detection circuit) are both connected to input voltage VIN, such that the sensed voltage Vsense at the output of resistor Rsense can be compared to the trip-point (reference) voltage Vtrip at the output of resistor Rtrip to sense which voltage amplitude is greater as referenced to input voltage VIN. For relatively low, positive voltages at node VIN, the trip-point voltage Vtrip is less than the sensed voltage Vsense, and the output 137 of comparator 136 is low. For relatively high, positive VIN voltages, the trip-point voltage Vtrip is greater than the sensed voltage Vsense, and the comparator output 137 is high to indicate an over-current condition sensed at the two comparator inputs. In the implementation of FIG. 1, when an over-current condition is sensed, comparator 136 sets a latch 140, which turns off the power PFET 150 to protect the load circuitry at node VOUT.

As shown in FIG. 1, the comparator trip-point voltage Vtrip is generated by a reference-voltage generation circuit 110. In particular, amplifier 112 forces the voltage across resistor R0, sensed at the amplifier's negative input, to be equal to fixed reference voltage Vref from bandgap circuit 111, causing current I1 to flow through resistor R0, NFET (n-type FET) device NFET1, and resistor Rtrip, such that Vref=I1*R0. The resultant voltage across resistor Rtrip is Vref*(Rtrip/R0). Note that reference-voltage generation circuit 110 is referenced to the input voltage VIN, while bandgap circuit 111 is referenced to the detection circuit's ground VSS.

Reference-voltage generation circuit 110 causes the trip-voltage Vtrip to track changes in the input voltage VIN such that the voltage drop across resistor Rtrip is constant, independent of VIN, as long as device NFET1 operates within an allowable voltage range set by device parameters and the integrated circuit technology limits. As the drain-to-source voltage of device NFET1 approaches technology limits, generation of hot-electron currents from drain to substrate begins to occur. The hot-electron current is an additional current flow through resistor Rtrip, resulting in an undesired increase in the voltage drop across resistor Rtrip resulting in a measurement error at comparator 136. This limits the range of input voltage VIN over which detection circuit 100 performs within specification. As input voltage VIN increases, hot-electron currents eventually increase to the point of device failure.

FIG. 2 shows a schematic diagram of a prior-art programmable reference-voltage generation circuit 210 that can be used in detection circuit 100 of FIG. 1 in place of reference-voltage generation circuit 110. Reference-voltage generation circuit 210 extends the allowable VIN voltage range of detection circuit 100 and also provides reference-voltage programmability. Note that, in reference-voltage generation circuit 210, bandgap circuit 211, amplifier 212, device NFET1, and resistors R0 and Rtrip are analogous to the corresponding, similarly labeled elements of reference-voltage generation circuit 110 of FIG. 1.

Reference-voltage generation circuit 210 provides programmability of the voltage across resistor Rtrip. In the implementation of FIG. 2, programmable current capability is provided by the combination of programmable cascode PFET current mirror 213 and programmable cascode NFET current mirror 214.

Programmable cascode PFET current mirror 213 has a master leg (formed from PFET mirror device PM1 and PFET cascode device PC1), a permanent slave leg (formed from PFET mirror device PM3, PFET cascode device PC3, and PFET switch device PS3), and a programmable slave leg (formed from PFET mirror device PM2, PFET cascode device PC2, and PFET switch device PS2). Since the gate of switch device PS3 is tied to ground node VSS, switch device PS3 is always on, and the permanent slave leg always draws current (that is, whenever supply node VDD is powered). On the other hand, the gate of switch device PS2 is tied to control signal enb2xp. For the particular (exemplary) implementation of FIG. 2 in which all of the mirror legs have the same current strength, when control signal enb2xp is high, switch device PS2 is off, the programmable slave leg does not draw current, and PFET current mirror 213 generates an output current equal to I1. When control signal enb2xp is low, switch device PS2 is on, the programmable slave leg does draw current, and PFET current mirror 213 generates an output current equal to 2*I1.

Similarly, programmable cascode NFET current mirror 214 has a master leg (formed from NFET mirror device NM1 and NFET cascode device NC1), a permanent slave leg (formed from NFET mirror device NM2, NFET cascode device NC2, and NFET switch device NS2), and three (i.e., first, second, and third) programmable slave legs (each formed from NFET mirror device NMi, NFET cascode device NC1, and NFET switch device NSi, where i=3,4,5). Note that any currents through the four slave legs of NFET current mirror 214 are summed at node Vtrip such that the resulting, cumulative current flows through resistor Rtrip. Since the gate of switch device NS2 is tied to supply node VDD, switch device NS2 is always on and the permanent slave leg always draws current (that is, whenever supply node VDD is powered). On the other hand, the gates of switch devices NS3, NS4, and NS5 are respectively tied to control signals en0, en1, and en2. For the particular implementation of FIG. 2 in which all of the mirror legs have the same current strength, except for the third slave leg whose current strength is double, control signals en0, en1, and en2 can be programmed to selectively turn on and off different programmable slave legs to achieve, in combination with the programmability of PFET current mirror 213, any current through resistor Rtrip from I1 to 10*I1 in increments of I1, such that the minimum voltage across Rtrip is Vref*(Rtrip/R0), and the maximum voltage is 10*Vref*(Rtrip/R0).

Note that, in the architecture of reference-voltage generation circuit 110 of FIG. 1, the current flowing through resistor R0 and device NFET1 also flows through resistor Rtrip. In the architecture of reference-voltage generation circuit 210 of FIG. 2, however, the current flowing through resistor R0 and device NFET1 is mirrored by PFET current mirror 213, and the resulting mirrored current is itself mirrored by NFET current mirror 214, which generates the current that flows through resistor Rtrip.

Configured between the four slave legs of NFET current mirror 214 and resistor Rtrip is a set 215 of four corresponding high-voltage NFET cascode devices NB2-NB5 whose gates are driven by a high-voltage cascode bias signal 216 generated by a PFET divide-by-2 voltage divider 217 formed by two matched, long-gate PFET devices PD1 and PD2. As such, the voltage applied to the gates of cascode devices NB2-NB5 is always one half of the input voltage VIN. As a result, for positive-threshold transistors, the source voltages of cascode devices NB2-NB5 will always be less than one half of voltage VIN, thus limiting the drain voltages of the NFET switch devices NS2-NS5, as well as the drain voltages of the rest of the devices in NFET current mirror 214, also to be less than one half of voltage VIN.

The maximum drain-source voltage across the high-voltage cascode devices NB2-NB5, added to the allowable voltage across the programmable NFET mirror structure, increases the maximum input voltage VIN for which the reference voltage Vtrip generated by reference-voltage generation circuit 210 is stable. As such, using reference-voltage generation circuit 210 instead of reference-voltage generation circuit 110 in detection circuit 100 of FIG. 1 extends the operating range of the detection circuit to higher levels of input voltage VIN. Nevertheless, it is desirable to extend that detection circuit operating range even beyond that which can be achieved using reference-voltage generation circuit 210.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 3:
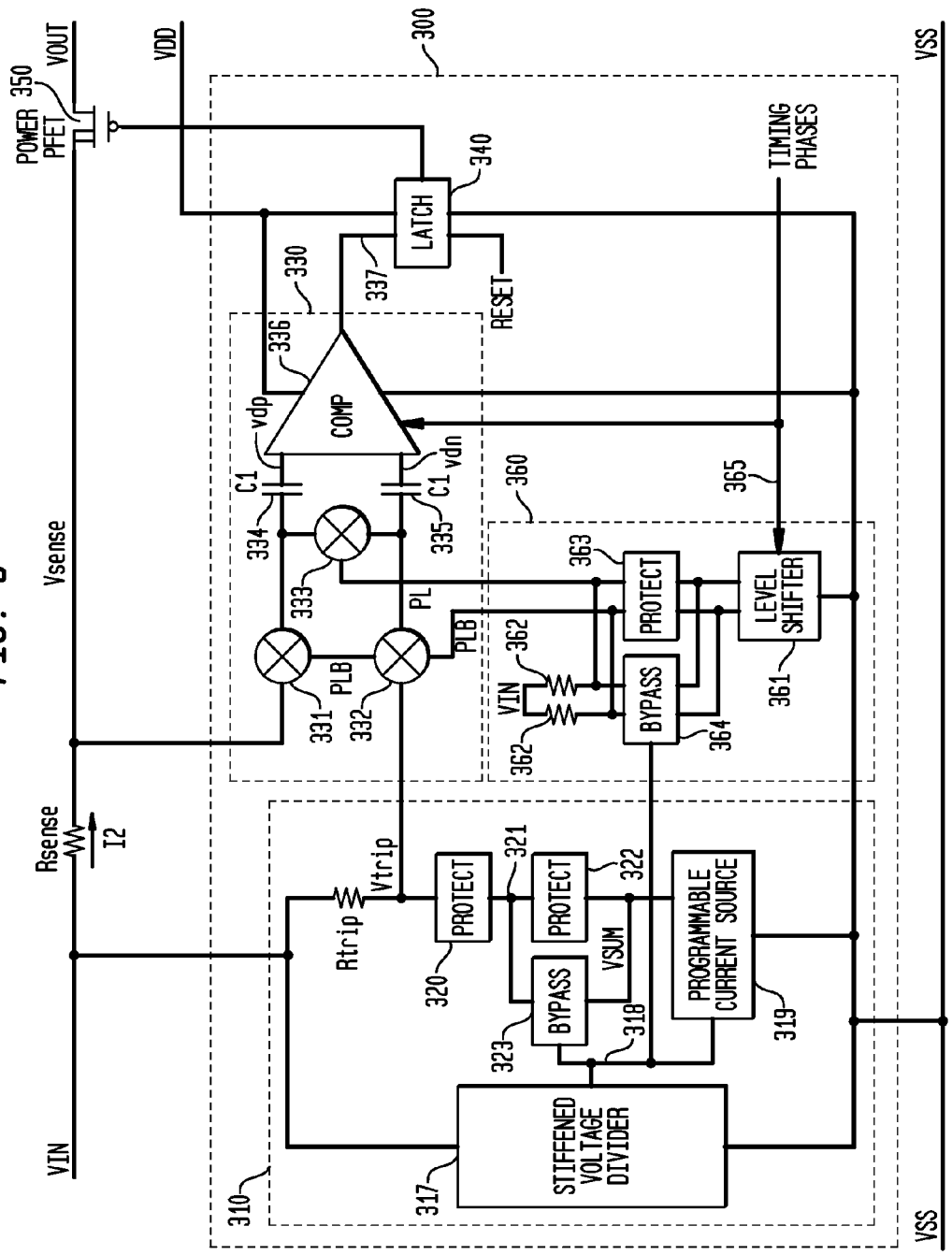
FIG. 3 shows a schematic block diagram of an over-current detection circuit according to one embodiment of the disclosure.

FIG. 3 shows a schematic block diagram of an over-current detection circuit 300 according to one embodiment of the disclosure. Over-current detection circuit 300 is analogous to over-current detection circuit 100 of FIG. 1. Like detection circuit 100, detection circuit 300 senses current flow (I2) from supply voltage VIN through power PFET switch 350 to drive load circuitry (not shown) at the load side of the switch at voltage VOUT. Similar to detection circuit 100, detection circuit 300 has a comparator 336 that compares (a voltage based on) sensed voltage Vsense and (a voltage based on) trip-point voltage Vtrip and, based on the results of that comparison, drives a latch 340 that turns off power PFET switch 350 when comparator 336 detects an over-current condition in current I2. Like detection circuit 100, detection circuit 300 has a reference-voltage generation circuit 310 that generates the trip-point voltage Vtrip. Different from detection circuit 100, comparator 336 of detection circuit 300 is part of switched-capacitor comparator circuitry 330, which also includes switches 331, 332, and 333 and capacitors 334 and 335. In addition, detection circuit 300 includes an enhanced level shifter 360 that is not found in detection circuit 100.

Reference-voltage generation circuit 310 includes resistor Rtrip, stiffened voltage divider 317, programmable current source 319, protection circuits 320 and 322, and bypass circuit 323. Resistor Rtrip and stiffened voltage divider 317 are analogous to resistor Rtrip and divide-by-2 voltage divider 217 of FIG. 2, and programmable current source 319 is analogous to the rest of the circuitry shown in FIG. 2. In particular, in one possible implementation, programmable current source 319 of FIG. 3 comprises resistor R0, device NFET1, bandgap circuit 211, amplifier 212, programmable current mirrors 213 and 214, and high-voltage cascode devices 215 of FIG. 2.

Figure 1:
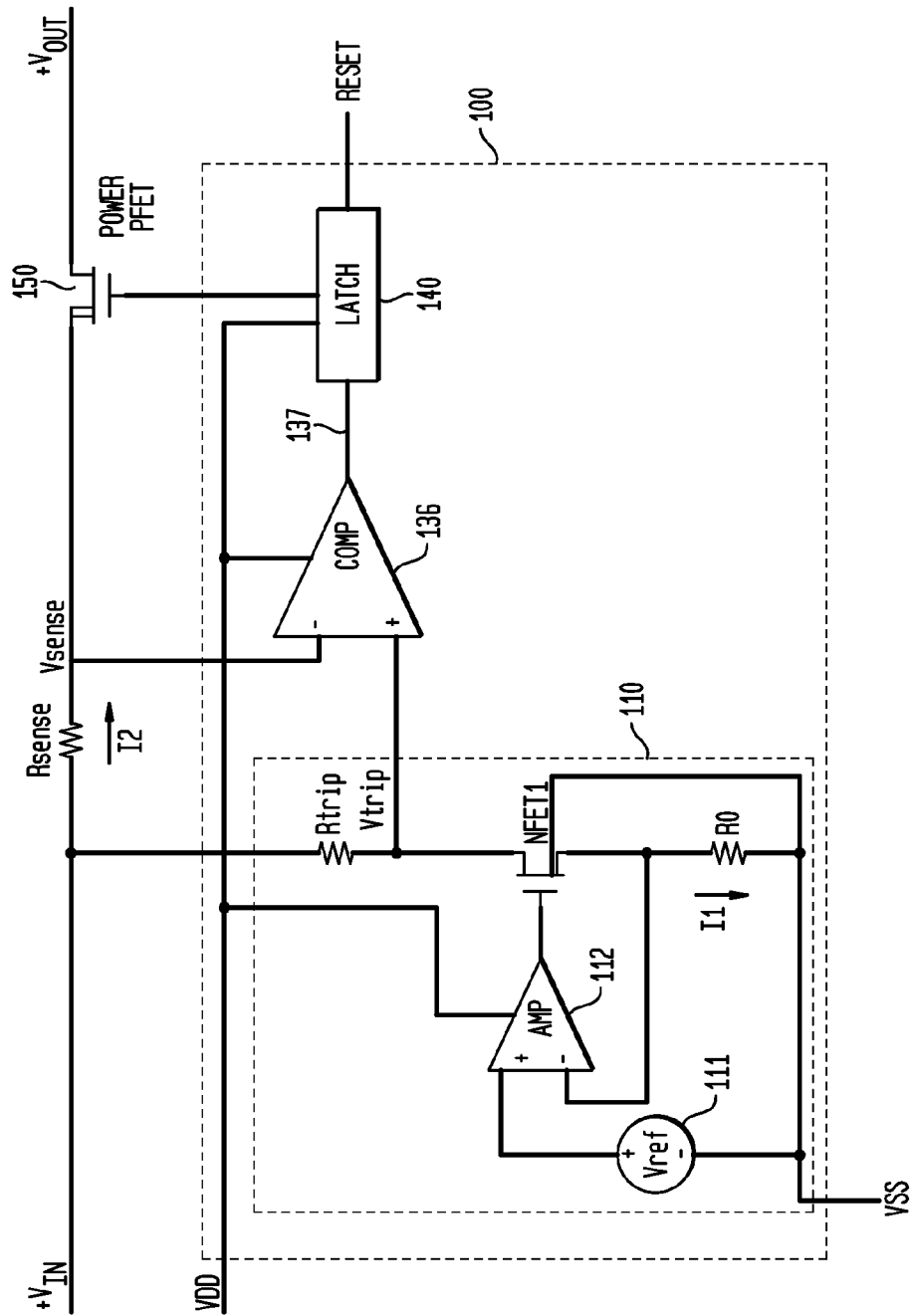
FIG. 1 shows a schematic block diagram of a prior-art over-current detection circuit.
Figure 2:
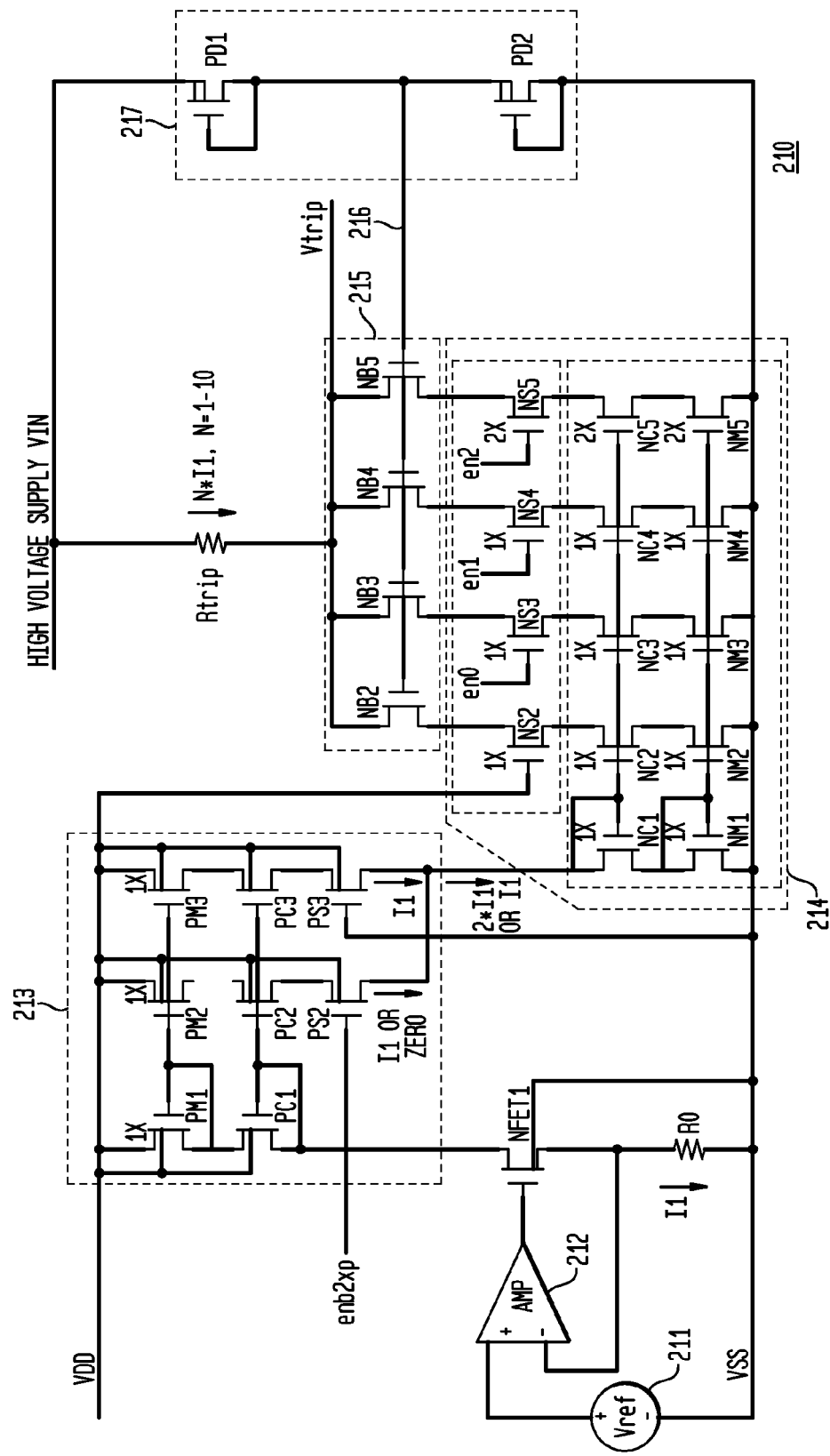
FIG. 2 shows a schematic diagram of a prior-art programmable reference-voltage generation circuit that can be used in the detection circuit of FIG. 1.

Reference-voltage generation circuit 310 is designed to extend the operating range of over-current detection circuit 300 to higher VIN voltage levels than can be achieved using reference-voltage generation circuit 210 of FIG. 2 in over-current detection circuit 100 of FIG. 1. In particular, reference-voltage generation circuit 310 allows operation of over-current detection circuit 300 with neither accuracy degradation nor failure at higher VIN voltage levels than achievable with known circuit techniques, including hot insertion of the integrated circuit containing detection circuit 300 into an operating system, such as hot socketing a circuit board containing that integrated circuit into an already powered rack of electronics. In addition, reference-voltage generation circuit 310 is designed to provide stable operation of over-current detection circuit 300 at relatively low VIN voltage levels. For example, in an implementation for which VDD is nominally 3.3V, reference-voltage generation circuit 310 can provide stable operation of over-current detection circuit 300 down to about 4V. The circuit will function down to VDD, but with increasing measurement degradation.

There are a number of features that enable reference-voltage generation circuit 310 to generate an accurate Vtrip voltage level over a wider voltage range of input signal VIN. For example, stiffened voltage divider 317 handles relatively low VIN voltage levels. In particular, like divide-by-2 voltage divider 217 of generation circuit 210, stiffened voltage divider 317 sets high-voltage cascode bias voltage 318 near VIN/2 for the highest VIN voltage levels, but holds the cascode bias voltage 318 higher, for example, at about 0.75 of VIN at the low end of the VIN voltage range. Protection circuits 320 and 322 protect the devices in programmable current source 319 from relatively high VIN voltage levels by reducing the total voltage drop across the programmable current source, while bypass circuit 323 bypasses protection circuit 322 for relatively low VIN voltage levels by shunting current around the protection circuit to ensure that the voltage drop across the programmable current source is sufficiently high for proper operation.

The combination of these features extends the voltage range of operation by adding an extra voltage drop above programmable current source 319, which extra voltage drop lowers the voltage applied to the programmable current source at the highest VIN voltages allowed, while enabling the programmable current source to operate as designed at low VIN voltages by bypassing, or essentially shorting out, protection circuit 322, so that sufficient voltage for normal operation of the programmable current source is still maintained. In particular, protection circuits 320 and 322 allow the voltage drop (VIN-Vtrip) across resistor Rtrip to remain constant by significantly reducing hot-electron current in the NFET devices of programmable current source 319. In this way, protection circuits 320 and 322 postpone to higher voltage levels the problem of circuit failure due to high hot-electron current which can occur with known circuit design techniques.

Operationally, at the highest tolerable VIN voltage level, the sum of the voltage drops across protection circuits 320 and 322 is sufficient to protect the NFET devices in programmable current source 319, even at the lowest programmed current level (i.e., 1*I1 of FIG. 2). The NFET devices of bypass circuit 323 do not conduct at the maximum VIN voltage. This is important because the drain-source voltage levels are too high to avoid excessive hot-electron current, which is a function of current, at the device drain node. With zero drain current, the sustainable voltage is higher than would otherwise be possible. Non-conducting NFET devices in bypass circuit 323 can sustain higher voltages and yet, in the same circuit, are allowed to conduct as VIN drops.

At maximum VIN voltage, stiffened voltage divider 317 provides cascode bias voltage 318 at half of VIN, so the bias levels are optimized for the highest level of VIN allowed. As VIN drops, the NFET devices in bypass circuit 323 begin to conduct current, and the voltage at node VSUM drops but still provides sufficient voltage (e.g., up to about 0.75 VIN) for the desired operation of the NFET devices in programmable current source 319 in saturation where the current is constant. The drain-source voltages of (i) the NFET devices in bypass circuit 323, (ii) the high-voltage cascode devices NB2-NB5, and (iii) the switch devices NS2-NS5 of NFET current mirror 214 are balanced sufficiently to ensure that each device operates below the voltage at which hot-electron current becomes an issue. As VIN drops further, the NFET devices in bypass circuit 323 conduct sufficient current to bypass protection circuit 322 to lower the voltage drop across these circuits. As VIN drops to the low end of its voltage range, the conduction through bypass circuit 323 increases such that virtually all current flow bypasses protection circuit 322, effectively shorting out those circuits so that the voltage at node VSUM remains above the voltage level at which the accuracy of the programmable current source would be impaired. In contrast, if the conduction through bypass circuit 323 were not sufficient to effectively short out protection circuit 322, then the voltage at node VSUM would be reduced towards VSS such that the fixed current needed to maintain a constant voltage across resistor Rtrip would not be able to be maintained by programmable current source 319, and the trip-point voltage Vtrip would be at a reduced, undesired level.

A conventional, divide-by-2 voltage divider, like voltage divider 217 of FIG. 2, would fail to provide the gate bias at the NFET devices of bypass circuit 323 to force the conduction required to perform the bypass function at the lower end of the VIN voltage range. Stiffened voltage divider 317 maintains a voltage sufficient to perform this function. A stiffened voltage divider could be implemented with a bias voltage and a voltage divider, but this approach would fail the goal of hot-insertion capability. To achieve hot-insertion capability, stiffened voltage divider 317 is designed to respond quickly to insertion into a powered high-voltage system.

The switched-capacitor comparator circuitry 330 along with the voltage-protection circuitry (362, 363, 364) of enhanced level shifter 360 are used to clock the input stage. In particular, input capacitors 334 and 335, having equal capacitance value C1, provide a dc voltage block to protect the FET devices (not shown) in comparator 336 from high input voltage levels at Vsense and Vtrip, both of which are near the input voltage VIN. The voltage-protection scheme provided by resistors 362, protection circuit 363, and bypass circuit 364 is similar to that provided by protection circuits 320 and 322 and bypass circuit 323.

Input switches 331, 332, and 333 between (i) nodes Vsense and Vtrip and (ii) the comparator input capacitors 334 and 335 are PFET devices since their NWell (body) bias voltage can be at voltage VIN as long as VIN does not exceed the breakdown voltage of NWell to substrate, which is the absolute maximum voltage the integrated circuit can handle for sustained voltages.

Figure 4:
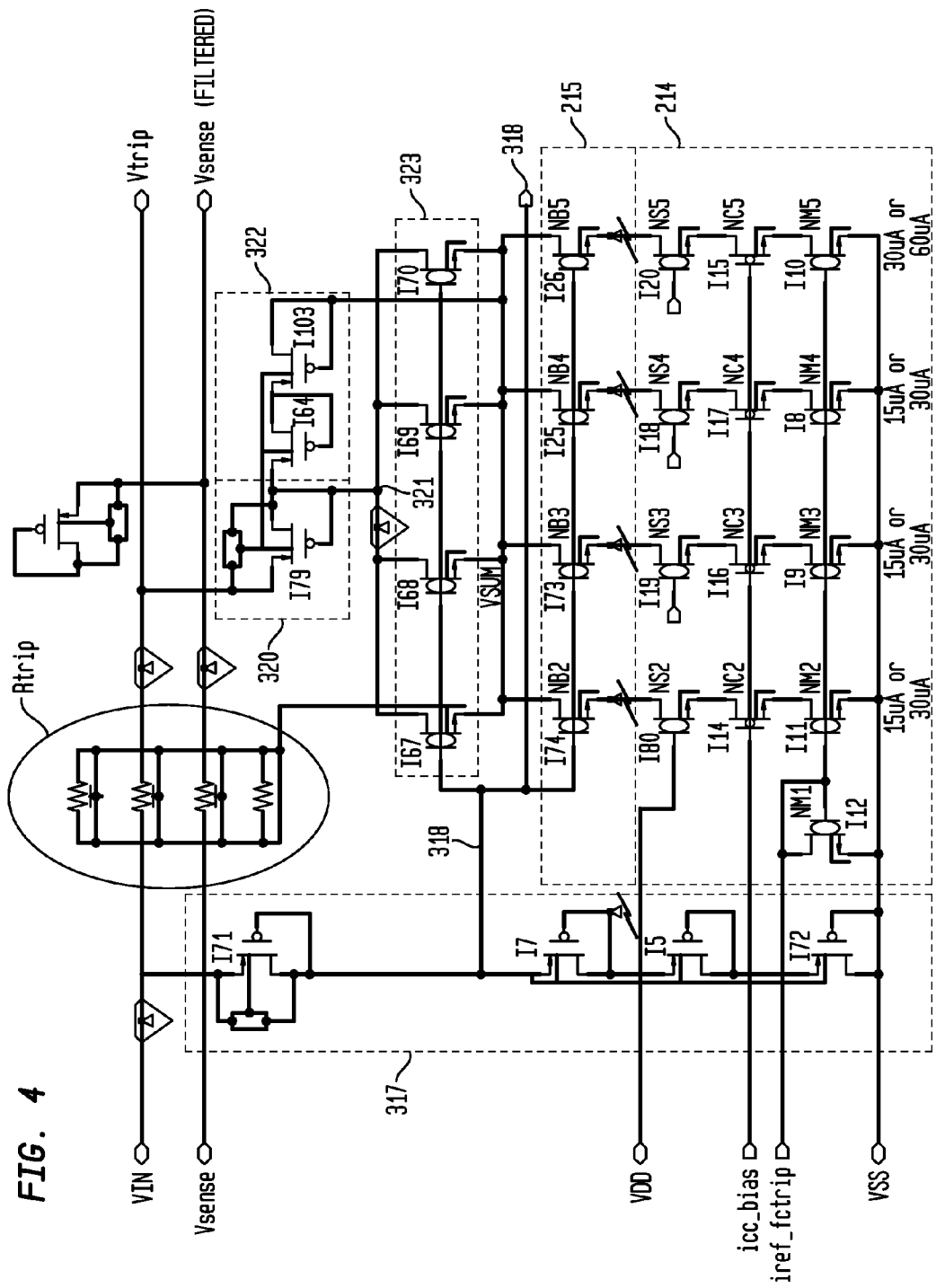
FIG. 4 shows a transistor-level schematic diagram of stiffened voltage divider 317, resistor Rtrip, protection circuits 320 and 322, and bypass circuit 323 of FIG. 3 as well as NFET current mirror 214 and high-voltage cascode devices 215 of FIG. 2, which are part of programmable current source 319 of FIG. 3.

FIG. 4 shows a transistor-level schematic diagram of stiffened voltage divider 317, resistor Rtrip, protection circuits 320 and 322, and bypass circuit 323 of FIG. 3 as well as NFET current mirror 214 and high-voltage cascode devices 215 of FIG. 2, which are part of programmable current source 319 of FIG. 3. Note that the conventional circuit elements resistor R0, NFET1, bandgap reference 211, amplifier 212, and PFET current mirror 213 are not shown in FIG. 4. In addition, cascode device NC1 of NFET current mirror 214 of FIG. 2 is missing from FIG. 4.

Protection circuit 320 (i.e., PFET device I79) plus protection circuit 322 (i.e., PFET devices I64 and I103) provide a voltage drop that lowers the voltage at node VSUM for all programmable current levels because, unlike resistors, the PFET gate-to-source voltages will always exceed a threshold voltage even at low currents. Proper design technique assures that a voltage drop exists across protection circuits 320 and 322 sufficient to protect the high-voltage NFET devices 215 and the NFET devices in current mirror 214 over the entire operating range, both in input voltage VIN and in programmed current. NFET devices I67-I70 in bypass circuit 323 are gate-biased by the bias voltage at node 318, with (i) their drains tied to node 321 connecting protection circuits 320 and 322 and (ii) their sources tied to node VSUM, which is the current summing node for NFET current mirror 214.

Stiffened voltage divider 317 comprises PFET devices I71, I7, I5, and I72. PFET device I71 is a long-channel device designed to set the voltage at node 318 at one half of input voltage VIN at the maximum VIN voltage level. PFET devices I7, I5, and I72 are short-channel devices, so that the three separate transistor thresholds will hold a voltage higher than half of VIN as the voltage VIN drops from the maximum voltage of, for example, 13.2V. When voltage VIN drops to the minimum voltage of, for example, 4.0V, the voltage at node 318 drops only to about 0.75*VIN. Note that between the maximum VIN voltage and the minimum VIN voltage, the output voltage 318 of stiffened voltage divider 317 scales (e.g., linearly) between 0.5*VIN and 0.75*VIN.

At the highest VIN voltage, the NFET devices in bypass circuit 323 do not conduct because the combination of protection circuits 320 and 322 establish a voltage at node VSUM that is higher than the voltage at node 318, making the gate-to-source voltage of the NFET devices in the bypass circuit negative. The NFET devices in bypass circuit 323 require a positive gate-to-source voltage to enable conduction. The voltage at node VSUM is biased by the combination of (i) protection circuits 320 and 322 and (ii) the voltage drop from node VIN to node Vtrip across resistor Rtrip, such that current mirror 214 operates within a desired voltage range that will allow a constant current to be maintained through resistor Rtrip, since voltages are below those that generate hot-electron current. The NFET devices in bypass circuit 323 do not conduct current at the highest permitted VIN voltages, because they are biased at voltages above which conduction can be sustained without device failure due to high electric fields.

As voltage VIN drops, the voltage at node VSUM drops by the same voltage since the current through the NFET devices of protection circuits 320 and 322 is unchanged. The combination of protection circuits 320 and 322 is designed such that the VIN voltage is allowed to drop to a voltage where current flow in the NFET devices of bypass circuit 323 can be sustained, while still maintaining sufficient voltage at node VSUM for stable current in the NFET devices of current mirror 214. Once the NFET devices in bypass circuit 323 slowly start to conduct current, the voltage at node VSUM no longer drops at the same rate with VIN because the NFET devices in protection circuit 322 will have reduced currents. At the lowest VIN voltages, the NFET devices in bypass circuit 323 conduct essentially all the current output by current mirror 214, effectively shorting protection circuit 322. By shorting protection circuit 322, the voltage at node VSUM is still within the voltage range for which the current is stable.

Note that, since PFET current mirror 213 is connected to VDD, not VIN, it does not require protection from high voltage.

Figure 5:
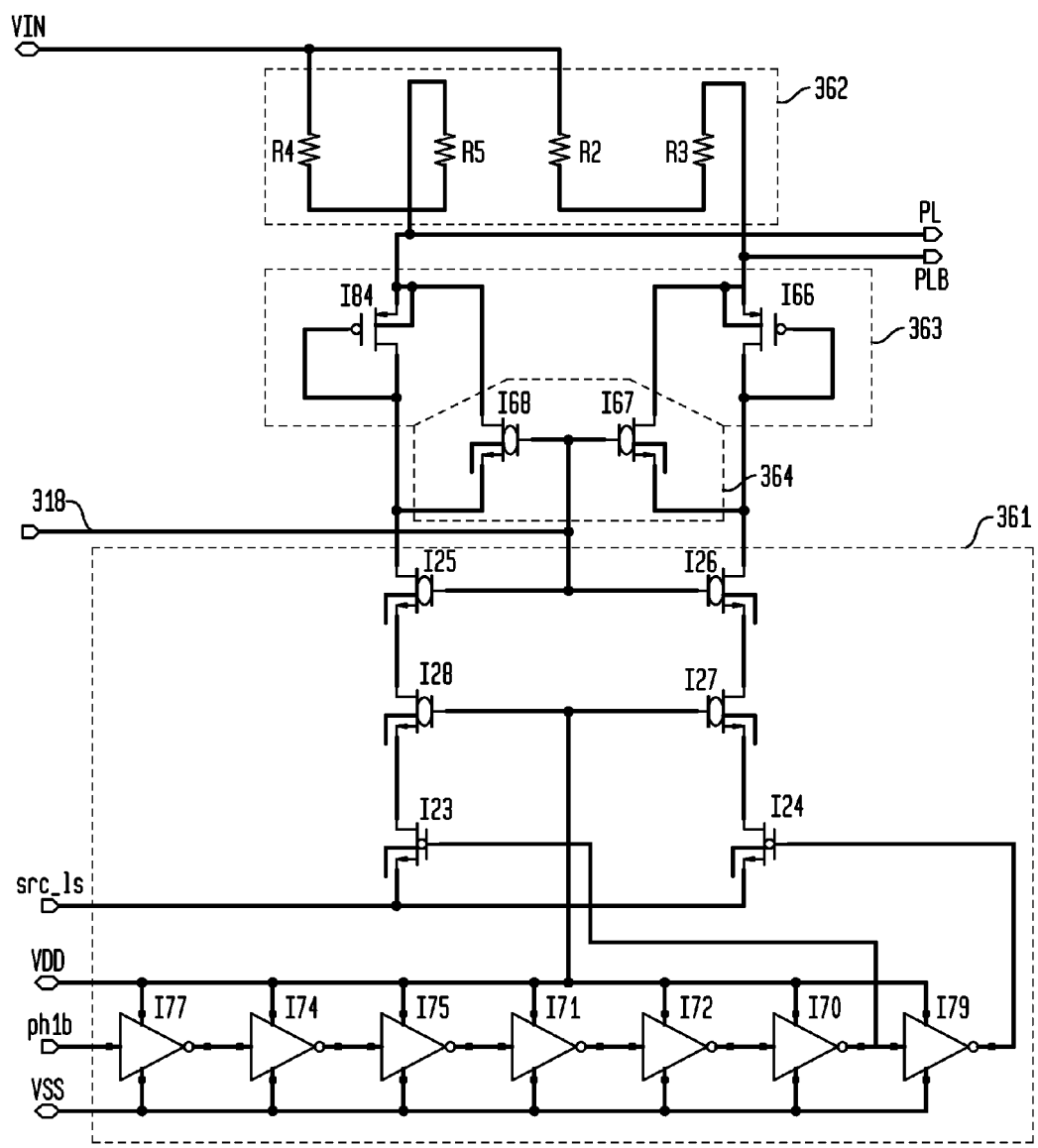
FIG. 5 shows a transistor-level schematic diagram of enhanced level shifter 360 comprising level shifter 361, resistors 362, protection circuit 363, and bypass circuit 364 of FIG. 3.

FIG. 5 shows a transistor-level schematic diagram of enhanced level shifter 360 comprising level shifter 361, resistors 362, protection circuit 363, and bypass circuit 364 of FIG. 3.

Figure 6:
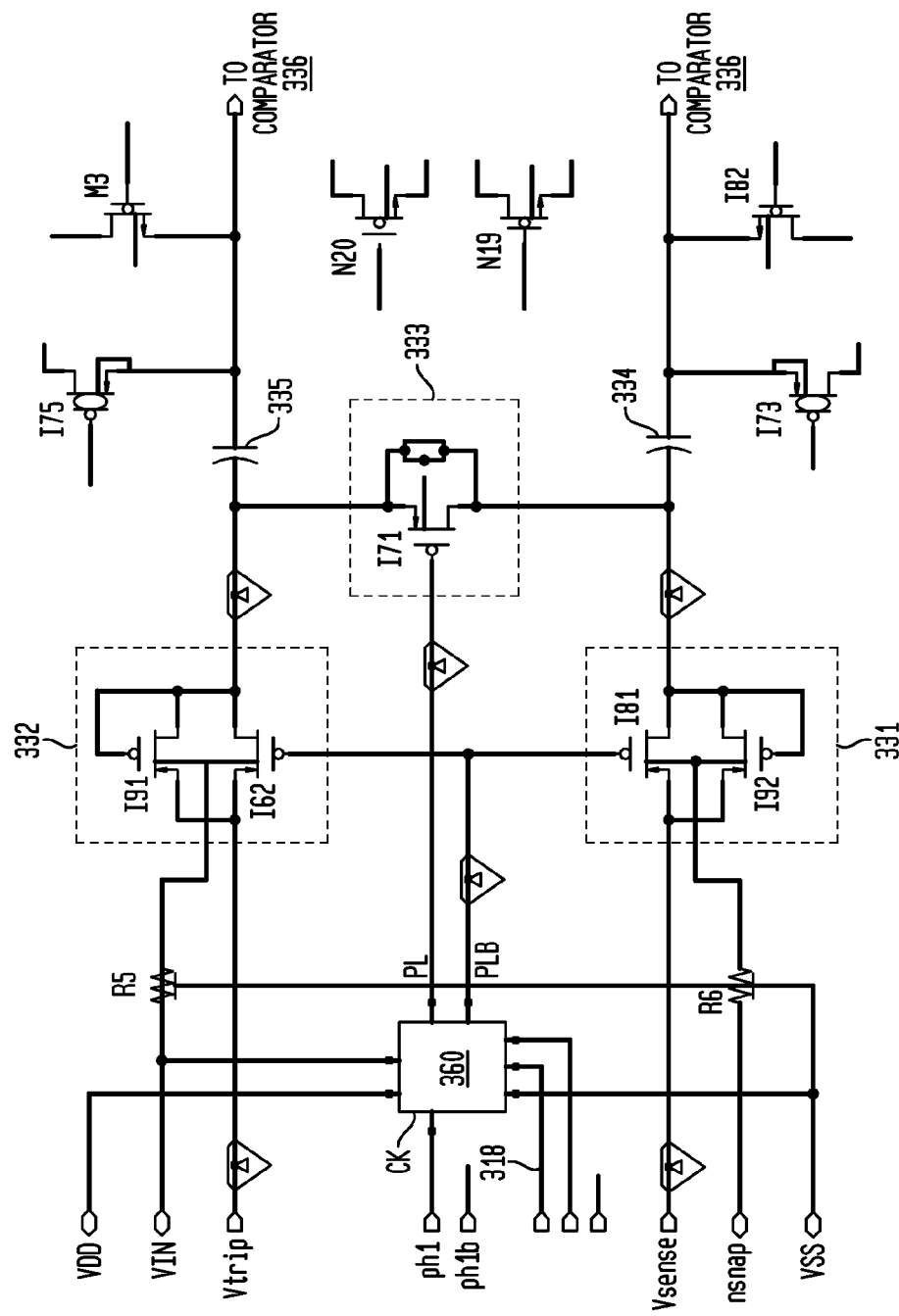
FIG. 6 shows a transistor-level schematic diagram of switches 331, 332, and 333 and capacitors 334 and 335 of the switched-capacitor comparator circuitry 330 of FIG. 3 as well as enhanced level shifter 360 of FIGs. C and F.

FIG. 6 shows a transistor-level schematic diagram of switches 331, 332, and 333 and capacitors 334 and 335 of the switched-capacitor comparator circuitry 330 of FIG. 3. FIG. 6 also includes enhanced level shifter 360 of FIGs. C and F.

Figure 7:
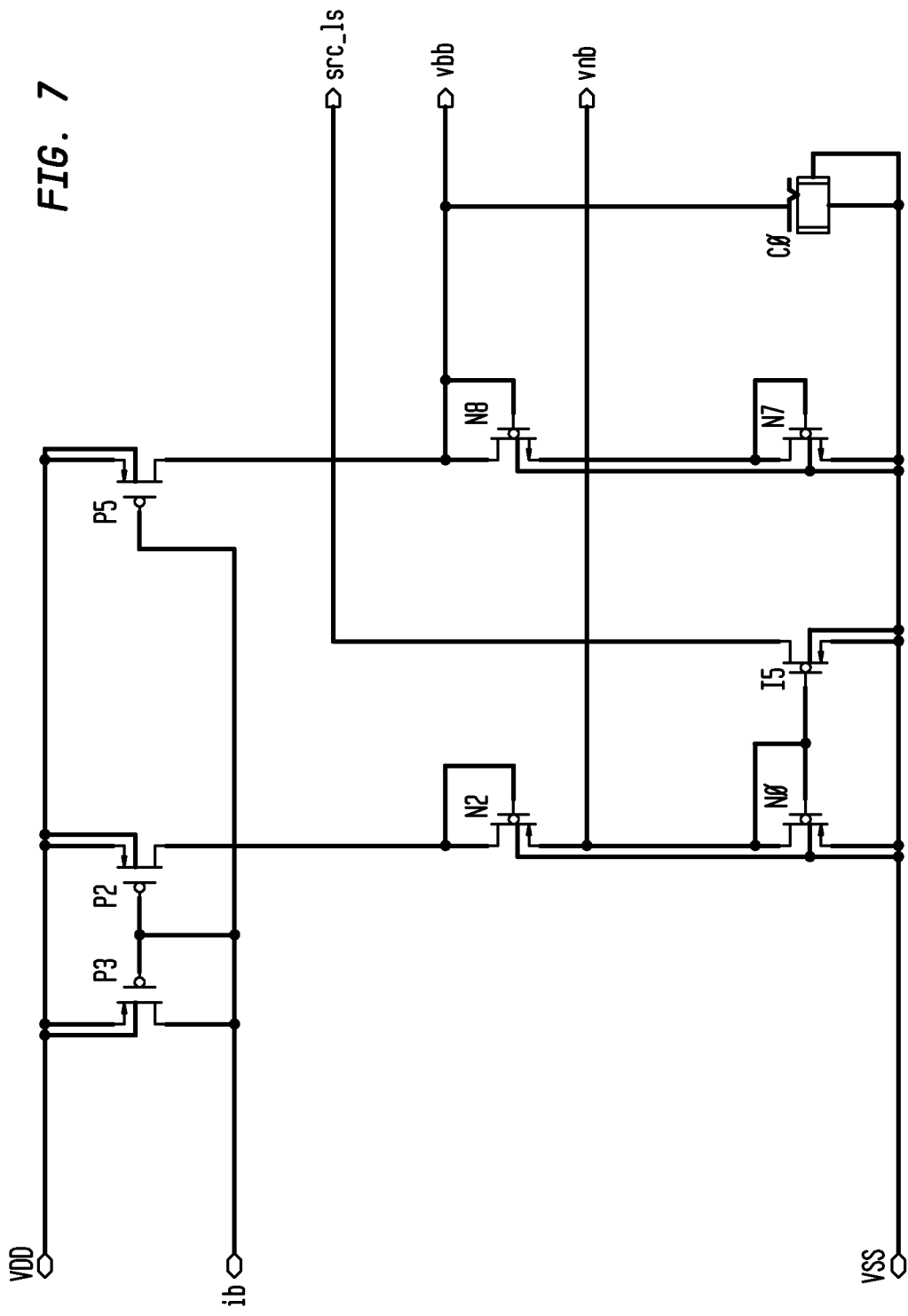
FIG. 7 shows a transistor-level schematic diagram of a circuit that generates the bias current src_ls for level shifter 361 of FIG. 5.

FIG. 7 shows a transistor-level schematic diagram of a circuit GA that generates the bias current src_ls for level shifter 361 of FIG. 5. Note that, to simplify the drawings, circuit GA and bias current src_ls are not depicted in FIG. 3.

Comparing the sensed voltage Vsense to the trip-point reference voltage Vtrip requires a comparator circuit capable of sustaining the same high voltages as Vsense and Vtrip, which are nearly at the same level as input voltage VIN. A switched-capacitor comparator is employed because its matched input capacitors 334 and 335 of metal-to-metal type with capacitance value C1 can sustain voltages higher than the voltages sustainable by transistor devices in the integrated circuit, even with the enhancements provided by the features presented. Resistors 362, protection circuit 363, and bypass circuit 364 of enhanced level shifter 360 protect level shifter 361 and switches 331, 332, and 333 from high voltages and from hot-electron currents.

Switched-capacitor comparator circuitry 330 is timed by phased switch-control signals PLB and PL that ensure that charge sampling and storage are implemented to preserve the correct voltage relationships to provide correct comparisons. The timing phases CXY are clocks that establish an auto-zero state and a valid output state. Switch 333 is closed during the auto-zero state. When switches 331 and 332 are both closed and switch 333 is open, capacitors 334 and 335 are allowed to charge and apply voltages Vsense and Vtrip to comparator 336. The function of level shifter 361 is to provide a voltage-domain change from the VDD domain of the timing phases CXY to the VIN domain of the switches. Input switches 331 and 332 driven by switch-control signal PLB generated by enhanced level shifter 360 are PFET-only switches.

Enhanced level shifter 360 adds the protection/bypass circuit combination of resistors 362, protection circuit 363, and bypass circuit 364 to allow operation of level shifter 361 in an extended voltage range. As shown in FIG. 5, level shifter 361 is a high-voltage level shifter implementation with timing delays appropriate for the switched-capacitor comparator circuitry 330 of FIG. 3. The full level shifter includes bias current src_ls generated by circuit GA of FIG. 7 and applied at the common source nodes of NFET devices 123 and 124 in level shifter 361 of FIG. 5.

Level shifter 361 is not capable of sustaining the highest VIN voltages without protection. Nevertheless, since the level shifter current is fixed and not programmable, protection of level shifter 361 is simplified compared to the protection of programmable current source 319 shown in FIG. 4. In particular, protection circuit 363 is less complex than protection circuits 320 and 322, because a fixed current allows protection circuit 363 to be designed to provide adequate voltage drop without having to worry about large changes in the operating current. Protection circuit 363 reduces the voltage applied to the NFET devices of level shifter 361 to reduce hot-electron currents. Bypass circuit 364 provides the same bypass function as described earlier for programmable current source 319. That is, bypass circuit 364 does not conduct at high VIN levels so that protection circuit 363 (i) protects level shifter 361 at the highest VIN voltages and (ii) gradually conducts current to bypass protection circuit 363 as VIN is reduced.

FIG. 6 combines (i) PFET input switches 331 and 332 driven by phased switch-control signal PLB and (ii) PFET capacitor-shorting switch 333 driven by phased switch-control signal PL with (iii) enhanced level shifter 360 of FIGs. C and F. Input switch 332 has a phase-driven operating switch device I62 and a hot-insertion protection device I91. Similarly, input switch 331 has a phase-driven operating switch device I81 and a hot-insertion protection device I92. Devices I75 and I73 complete the hot-insertion protection structure of the switched-capacitor comparator circuitry 330. The protection devices I91 and I92 conduct current during hot insertion (i) to mostly bypass the switch devices I62 and I81 so that the voltages imposed across the switch devices do not exceed their breakdown voltage and (ii) to charge input capacitors 334 and 335 with a voltage approaching the input voltage VIN. To complete the hot-insertion protection, low-threshold PFET devices I75 and I73 conduct during hot insertion to hold the comparator input nodes vdp and vdn near zero volts so that all transistors connected to these nodes are protected. The switch devices I62 and I81 are not conducting during hot insertion because level shifter 361 is nonfunctional, forcing the gates of the switch devices to follow VIN.

Switch devices I62 and I81, which are driven at their gates by switch-control signal PLB generated by enhanced level shifter 360, are protected during hot-socketing operations by protection devices I91 and I92, respectively, by bypassing switch devices I62 and I81 while they are nonconductive, which prevents developing a source-to-drain voltage sufficient to damage the switch devices. During normal (i.e., not hot-socketing) operations, protection devices I91 and I92 do not degrade switch isolation in spite of their potential for current conduction because, with devices I62 and I81 always conducting strongly with gate-to-source voltage of, for example, nominally 2.64V, the protection devices will always be shunted by the active switch device.

Low-threshold PFET devices I75 and I73, in conjunction with bypass devices I91 and I92, respectively, protect sensitive MOS devices in other circuits (e.g., comparator 336) attached to output nodes vdp and vdn during hot socketing. In particular, with VDD initially at VSS (the integrated circuit negative supply voltage) and an instantaneous voltage applied at nodes VIN and Vsense, nodes vdp and vdn are held to less than one volt while protection devices I91 and I92 protect input switches 331 and 332 so that capacitors 334 and 335 immediately store the majority of the high voltage seen at the inputs, which quickly reduces the voltage across input switches I62 and I81 in addition to holding the nodes vdp and vdn to 1V or less to protect other devices.

Although the present disclosure has been described in the context of over-current detection circuits having switched capacitors and an enhanced level shifter, those skilled in that art will understand that those elements may be omitted in other over-current detection circuits of the present disclosure.

Although the present disclosure has been described in the context of reference-voltage generation circuits for over-current detection circuits, those skilled in that art will understand that reference-voltage generation circuits of the present disclosure can be used to generate supply-referenced fixed or programmable voltages which may have other applications. Where design restrictions of this particular application, current sensing, do not apply, the invention can be used as a replacement for VSS-referenced (ground-referenced) voltages such as bandgap voltages, and can be used in a similar manner as a bandgap reference where supply-referenced signals are used instead of ground-referenced signaling.

Although the present disclosure has been described in the context of reference-voltage generation circuits that generate a voltage signal (e.g., Vtrip) that is referenced to a positive supply voltage (e.g., VIN), those skilled in the art will understand that reference-voltage generation circuits of the disclosure can be designed to generate a voltage signal that is referenced to a negative supply voltage. Reversal of PFET and NFET structures in the circuit design will enable applications for which the supply voltage is negative with respect to VSS (often called ground or common). Such structure reversal is technology dependent in that the invention relies on PFETs with well ties to VIN since these FETs are in NWells to isolate from P-type substrate. For technology appropriate for negative supply voltages, the NFETs are in PWells to isolate from N-type substrate.

Although the present disclosure has been described in the context of a programmable current source having p-type and n-type current mirrors with particular numbers of slave legs having particular current strengths that can achieve a particular range of currents (i.e., I1 to 10*I1), those skilled in the art will understand that, in alternative implementations, programmable current sources having p-type and/or n-type current mirrors with different numbers of slave legs having different current strengths can be designed to achieve different ranges of currents. It will be further understood that alternative embodiments of the present disclosure may have a non-programmable current source. For example, the non-programmable current source could include a non-programmable PFET current mirror and/or a non-programmable NFET current mirror.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

Unless explicitly stated otherwise, each numerical value and range should be interpreted as being approximate as if the word "about" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi polar device when an embodiment of the invention is implemented using bi-polar transistor technology.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

I claim:

1. An integrated circuit having a reference-voltage generation circuit comprising:
   a reference resistor (e.g., Rtrip) connected to an input node at an input supply voltage level (VIN);
   a constant current source configured to generate a constant current signal;
   current mirror circuitry configured to generate a reference current signal based on the constant current signal, wherein the reference current signal is applied to the reference resistor to generate a reference voltage signal;
   voltage-protection circuitry configured to shield the current mirror circuitry from relatively high voltage levels at the input node, by lowering a voltage applied to the current mirror circuitry; and
   bypass circuitry configured to bypass at least some of the voltage-protection circuitry at relatively low voltage levels at the input node to ensure proper operation of the current mirror circuitry at the relatively low voltage levels, by providing, when active, a path, for at least a portion of the reference current, that is in parallel with the bypassed voltage-protection circuitry.

2. The invention of claim 1, wherein:
   the current mirror circuitry comprises one or more high-voltage cascode devices (e.g., 215) configured to protect current mirror devices in the current mirror circuitry from the relatively high voltage levels; and
   the reference-voltage generation circuit further comprises a stiffened voltage divider (e.g., 317) that generates a bias voltage applied to the one or more high-voltage cascode devices, wherein the stiffened voltage divider generates the bias voltage as a fraction of the input node voltage, wherein the fraction varies with the voltage level of the input node.

3. The invention of claim 2, wherein:
   the fraction is about 0.5 at the relatively high voltage levels; and
   the fraction is greater than 0.5 at the relatively low voltage levels.

4. The invention of claim 3, wherein the fraction is about 0.75 at the relatively low voltage levels.

5. The invention of claim 1, wherein the current mirror circuitry comprises one or more programmable current mirrors (e.g., 213, 214).

6. The invention of claim 5, wherein the one or more programmable current mirrors comprise:
   a programmable p-type current minor (e.g., 213) connected to the constant current source and configured to minor the constant current signal to generate an intermediate current signal; and
   a programmable n-type current minor (e.g., 214) connected to the programmable p-type current minor and configured to minor the intermediate current signal to generate the reference current signal, wherein the voltage protection circuitry and the bypass circuitry are connected between the programmable n-type current minor and the input node.

7. The invention of claim 1, wherein:
   the reference-voltage generation circuit is part of an over-current detection circuit (e.g., 300) of the integrated circuit; and
   the over-current detection circuit further comprises a comparator (e.g., 336) configured to compare the reference voltage signal to a sensed voltage signal (e.g., Vsense) generated based on the voltage level at the input node and generate a comparator output signal (e.g., 337) indicating presence or absence of an over-current condition.

8. The invention of claim 7, wherein the over-current detection circuit further comprises:
   switched capacitors (e.g., 334, 335) connected between (i) the reference voltage signal and the sensed voltage signal and (ii) corresponding inputs to the comparator;
   a level shifter (e.g., 361) configured to convert a timing signal in a voltage domain of the integrated circuit into switch-control signals (e.g., PL, PLB) for switches (e.g., 331, 332, 333) of the switched capacitors in a voltage domain of the input node;
   level-shifter voltage protection circuitry (e.g., 362 and 363) configured to shield the level shifter from the relatively high voltage levels at the input node; and
   level-shifter bypass circuitry (e.g., 364) configured to bypass at least some of the level-shifter voltage protection circuitry at the relatively low voltage levels at the input node to ensure proper operation of the level shifter at the relatively low voltage levels.

9. The invention of claim 1, wherein the integrated circuit is a field-programmable gate array.

10. The invention of claim 1, wherein:
    the current minor circuitry comprises one or more high-voltage cascode devices (e.g., 215) configured to protect current minor devices in the current minor circuitry from the relatively high voltage levels;
    the reference-voltage generation circuit further comprises a stiffened voltage divider (e.g., 317) that generates a bias voltage applied to the one or more high-voltage cascode devices, wherein the stiffened voltage divider generates the bias voltage as a fraction of the input node voltage, wherein the fraction varies with the voltage level of the input node;

the current minor circuitry comprises one or more programmable current minors (e.g., 213, 214);

the one or more programmable current minors comprise:

a programmable p-type current minor (e.g., 213) connected to the constant current source and configured to minor the constant current signal to generate an intermediate current signal; and a programmable n-type current minor (e.g., 214) connected to the programmable p-type current minor and configured to minor the intermediate current signal to generate the reference current signal, wherein the voltage protection circuitry and the bypass circuitry are connected between the programmable n-type current minor and the input node;

the reference-voltage generation circuit is part of an over-current detection circuit (e.g., 300) of the integrated circuit;

the over-current detection circuit further comprises a comparator (e.g., 336) configured to compare the reference voltage signal to a sensed voltage signal (e.g., Vsense) generated based on the voltage level at the input node and generate a comparator output signal (e.g., 337) indicating presence or absence of an over-current condition; and the over-current detection circuit further comprises:

switched capacitors (e.g., 334, 335) connected between (i) the reference voltage signal and the sensed voltage signal and (ii) corresponding inputs to the comparator;

a level shifter (e.g., 361) configured to convert a timing signal in a voltage domain of the integrated circuit into switch-control signals (e.g., PL, PLB) for switches (e.g., 331, 332, 333) of the switched capacitors in a voltage domain of the input node;

level-shifter voltage protection circuitry (e.g., 362 and 363) configured to shield the level shifter from the relatively high voltage levels at the input node; and level-shifter bypass circuitry (e.g., 364) configured to bypass at least some of the level-shifter voltage protection circuitry at the relatively low voltage levels at the input node to ensure proper operation of the level shifter at the relatively low voltage levels.

11. The invention of claim 10, wherein:

the fraction is about 0.5 at the relatively high voltage levels; and the fraction is about 0.75 at the relatively low voltage levels.

12. The invention of claim 10, wherein the integrated circuit is a field-programmable gate array.

13. An integrated circuit, comprising:

a reference-voltage generation circuit comprising:

a reference resistor connected to an input node at an input supply voltage level (VIN);

a constant current source configured to generate a constant current signal;

current mirror circuitry configured to generate a reference current signal based on the constant current signal, wherein the reference current signal is applied to the reference resistor to generate a reference voltage signal;

voltage-protection circuitry configured to shield the current mirror circuitry from relatively high voltage levels at the input node; and bypass circuitry configured to bypass at least some of the voltage-protection circuitry at relatively low voltage levels at the input node to ensure proper operation of the current mirror circuitry at the relatively low voltage levels, wherein the reference-voltage generation circuit is part of an over-current detection circuit comprising a comparator configured to compare the reference voltage signal to a sensed voltage signal generated based on the voltage level at the input node and generate a comparator output signal indicating presence or absence of an over-current condition.

14. The integrated circuit of claim 13, wherein:

the fraction is about 0.5 at the relatively high voltage levels; and the fraction is greater than 0.5 at the relatively low voltage levels.

15. The invention of claim 4, wherein the fraction is about 0.75 at the relatively low voltage levels.

16. The invention of claim 14, wherein the current mirror circuitry comprises one or more programmable current mirrors.

17. The invention of claim 16, wherein the one or more programmable current mirrors comprise:

a programmable p-type current minor connected to the constant current source and configured to minor the constant current signal to generate an intermediate current signal; and a programmable n-type current minor connected to the programmable p-type current minor and configured to minor the intermediate current signal to generate the reference current signal, wherein the voltage protection circuitry and the bypass circuitry are connected between the programmable n-type current minor and the input node.

* * * * *